United States Patent
Itadani et al.

(10) Patent No.: US 10,280,977 B2
(45) Date of Patent: May 7, 2019

(54) SLIDE COMPONENT

(71) Applicants: EAGLE INDUSTRY CO., LTD., Minato-ku, Tokyo (JP); NOK CORPORATION, Minato-ku, Tokyo (JP)

(72) Inventors: Masatoshi Itadani, Tokyo (JP); Kazumasa Sunagawa, Tokyo (JP); Tetsuzo Okada, Tokyo (JP); Keiichi Chiba, Tokyo (JP); Kenji Kiryu, Tokyo (JP); Akiko Koga, Fujisawa (JP)

(73) Assignees: EAGLE INDUSTRY CO., LTD, Tokyo (JP); NOK CORPORATION, Tokyo (JP)

( * ) Notice: Subject to any disclaimer, the term of this patent is extended or adjusted under 35 U.S.C. 154(b) by 0 days.

(21) Appl. No.: 15/566,169

(22) PCT Filed: Apr. 7, 2016

(86) PCT No.: PCT/JP2016/061342
§ 371 (c)(1),
(2) Date: Oct. 12, 2017

(87) PCT Pub. No.: WO2016/167170
PCT Pub. Date: Oct. 20, 2016

(65) Prior Publication Data
US 2018/0112711 A1  Apr. 26, 2018

(30) Foreign Application Priority Data
Apr. 16, 2015 (JP) ................................. 2015-083809

(51) Int. Cl.
*F16J 15/34* (2006.01)
*F16C 33/04* (2006.01)
(Continued)

(52) U.S. Cl.
CPC ............ *F16C 33/043* (2013.01); *C23C 16/26* (2013.01); *C23C 16/27* (2013.01); *F16C 17/04* (2013.01);
(Continued)

(58) Field of Classification Search
CPC ........ F16C 33/043; F16C 33/24; F16C 33/74; F16C 17/04; F16C 2206/04; C23C 16/27; C23C 16/26; F16J 15/34; F16J 15/3496
See application file for complete search history.

(56) References Cited

U.S. PATENT DOCUMENTS 5,544,896 A * 8/1996 Draskovich .......... F16J 15/3404
                                                          277/404
9,051,882 B2 * 6/2015 Copeland .................. F02C 7/28
(Continued)

FOREIGN PATENT DOCUMENTS

JP   H05163495 A   6/1993
JP   H09132478 A   5/1997
(Continued)

OTHER PUBLICATIONS

International Search Report (ISR) dated Jun. 21, 2016, issued for International application No. PCT/JP2016/061342.

*Primary Examiner* — Gilbert Y Lee
(74) *Attorney, Agent, or Firm* — Law Office of Katsuhiro Arai

(57) ABSTRACT

In an embodiment, a slide component includes a circular ring-shaped stationary-side seal ring 5 fixed to a stationary side and a circular ring-shaped rotating-side seal ring 3 rotating with a rotating shaft 1, and relatively rotates respective opposed sliding faces S of the stationary-side seal ring 5 and the rotating-side seal ring 3, thereby sealing a sealed fluid present on one side in a radial direction of the sliding face relatively rotating and sliding, wherein the sealed fluid is a silicate containing fluid; and on at least either one sliding (Continued)

face of the stationary-side seal ring 5 and the rotating-side seal ring 3, an amorphous carbon film 10 formed by using hydrocarbon gas not containing organosilicon compound gas in a plasma CVD method is laminated. The slide component can seal a silicate containing sealed fluid to which silicate is added.

4 Claims, 2 Drawing Sheets

(51) Int. Cl.
*C23C 16/26* (2006.01)
*F16C 33/74* (2006.01)
*F16C 17/04* (2006.01)
*F16C 33/24* (2006.01)
*C23C 16/27* (2006.01)

(52) U.S. Cl.
CPC .............. *F16C 33/24* (2013.01); *F16C 33/74* (2013.01); *F16J 15/34* (2013.01); *F16C 2206/04* (2013.01)

(56) References Cited

U.S. PATENT DOCUMENTS

| | | | |
|---|---|---|---|
| 9,353,865 B2 * | 5/2016 | Lattin | F16J 15/342 |
| 9,841,107 B2 * | 12/2017 | Otschik | F16J 15/162 |
| 2006/0038353 A1 * | 2/2006 | Murakami | F04D 29/126 |
| | | | 277/399 |
| 2010/0061676 A1 | 3/2010 | Sugiyama et al. | |

FOREIGN PATENT DOCUMENTS

| | | |
|---|---|---|
| JP | H11108199 A | 4/1999 |
| JP | 2004225725 A | 8/2004 |
| JP | 2006057725 A | 3/2006 |
| JP | WO2008133197 A1 | 11/2008 |
| JP | 2014185691 A | 10/2014 |

* cited by examiner

SLIDE COMPONENT

This application is the U.S. National Phase under 35 U.S.C. § 371 of International Application PCT/JP2016/061342, filed Apr. 7, 2016, which claims priority to Japanese Patent Application No. 2015-083809, filed Apr. 16, 2015. The International Application was published under PCT Article 21(2) in a language other than English.

TECHNICAL FIELD

The present invention relates to slide components suitable for, for example, mechanical seals, bearings, and other slide units. In particular, the present invention relates to slide components such as seal rings or bearings required to reduce friction by interposing a fluid between sliding faces and to prevent leakage of the fluid from the sliding faces.

BACKGROUND ART

A mechanical seal which is an example of a slide component is evaluated for its performance by a leakage rate, a wear rate, and a torque. In the conventional arts, by optimizing the seal material and the sliding surface roughness of mechanical seals, their performance is increased to achieve low leakage, long life, and low torque. However, due to growing awareness of environmental problems in recent years, a further improvement in the performance of mechanical seals has been demanded, for which technology development beyond the limits of the conventional arts has been required.

Conventionally, as the seal material of the mechanical seal, carbon, silicon carbide (SiC), cemented carbide and the like have been used. Among others, silicon carbide has been often used for the reason of being superior in corrosion resistance, wear resistance and the like (for example, see Patent Document 1 and Patent Document 2).

Moreover, since silicon carbide is a preferred material as the seal material of the mechanical seal but it is expensive and has poor workability, in order to be inexpensive, be more superior in corrosion resistance and wear resistance, and improve workability, a mechanical seal in which a sliding face of a seal ring is covered with diamond-like carbon (hereinafter, sometimes referred to as "DLC") is proposed (for example, see Patent Document 3).

Further, in order to improve initial conformability of sliding faces of a seal ring of a mechanical seal, the mechanical seal in which the sliding face of the seal ring is covered with DLC is also known (for example, see Patent Document 4).

CITATION LIST

Patent Document

[Patent Document 1] JP H09-132478 A
[Patent Document 2] JP H05-163495 A
[Patent Document 3] JP 2014-185691 A
[Patent Document 4] JP H11-108199 A

SUMMARY OF THE INVENTION

Problem to be Solved by the Invention

Meanwhile, for example, in a mechanical seal of a water pump used for cooling of a water cooled engine, it is confirmed that as time passes, an LLC additive which is a kind of an antifreeze, such as silicate, phosphate or the like, might be concentrated on a sliding face, deposits might be generated, and a function of the mechanical seal might be decreased. Generation of deposits is conceivable as a phenomenon which occurs as well in a mechanical seal of a device for handling chemical or oil.

The present inventor knew that, since the material consisting of silicon carbide described in the above Patent Documents 1 and 2 contains silicon, in a case where a sealed fluid is an LLC containing silicate, a problem in that a silicate compound is deposited on a sliding face and smoothness of the sliding face is lost, which leads to leakage of LLC occurs.

Moreover, the DLC described in the above Patent Documents 3 and 4 is characterized by containing silicon in order to improve adhesion to a base material and decrease friction coefficient, and, also in this case as with the above case of silicon carbide, there was a problem in that a silicate compound is deposited on a sliding face and smoothness of the sliding face is lost, which leads to leakage of LLC.

The present invention has an object to provide, in a slide component such as a mechanical seal which seals a silicate containing sealed fluid such as an LLC to which silicate is added, a slide component capable of preventing a problem in that a silicate compound is deposited on a sliding face and smoothness thereof is lost, which leads to leakage of the sealed fluid.

Means for Solving Problem

In order to achieve the above object, in a first aspect, a slide component of the present invention is a slide component which includes a circular ring-shaped stationary-side seal ring fixed to a stationary side and a circular ring-shaped rotating-side seal ring rotating with a rotating shaft, and relatively rotates respective opposed sliding faces of the stationary-side seal ring and the rotating-side seal ring, thereby sealing a sealed fluid present on one side in a radial direction of the sliding face relatively rotating and sliding, characterized in that:

the sealed fluid is a silicate containing fluid; and
on at least either one sliding face of the stationary-side seal ring and the rotating-side seal ring, an amorphous carbon film formed by using hydrocarbon gas not containing organosilicon compound gas in a plasma CVD method is laminated.

According to the first aspect, in a slide component such as a mechanical seal which seals a silicate containing sealed fluid such as an LLC to which silicate is added, a slide component capable of preventing a problem in that a silicate compound is deposited on a sliding face and smoothness thereof is lost, which leads to leakage of the sealed fluid can be provided.

Moreover, in a second aspect, the slide component according to the first aspect of the present invention is characterized in that a base material of the stationary-side seal ring or the rotating-side seal ring is silicon carbide.

According to the second aspect, even if silicon carbide which is a preferred material having good heat dissipation performance and excellent in wear resistance as a seal material of the mechanical seal and the like is used as a base material of the stationary-side seal ring or the rotating-side seal ring, leakage of the silicate containing sealed fluid can be prevented.

Effects of the Invention

The present invention exhibits the following superior effects.

(1) According to the first aspect, on at least either one sliding face of a stationary-side seal ring and a rotating-side seal ring, an amorphous carbon film formed by using hydrocarbon gas not containing organosilicon compound gas in a plasma CVD method is laminated, whereby in a slide component such as a mechanical seal which seals a silicate containing sealed fluid such as an LLC to which silicate is added, a slide component capable of preventing a problem in that a silicate compound is deposited on a sliding face and smoothness thereof is lost, which leads to leakage of the sealed fluid can be provided.

(2) According to the second aspect, a base material of the stationary-side seal ring or the rotating-side seal ring is silicon carbide, whereby even if silicon carbide which is a preferred material having good heat dissipation performance and excellent in wear resistance as a seal material of the mechanical seal and the like is used as a base material of the stationary-side seal ring or the rotating-side seal ring, leakage of the silicate containing sealed fluid can be prevented.

DESCRIPTION OF EMBODIMENTS

Hereinafter with reference to the drawings, embodiments for carrying out the invention will be described illustratively.

However, the dimensions, materials, shapes, relative arrangements, and others of components described in the embodiments are not intended to limit the scope of the present invention only to them unless explicitly stated otherwise.

Figure 1:
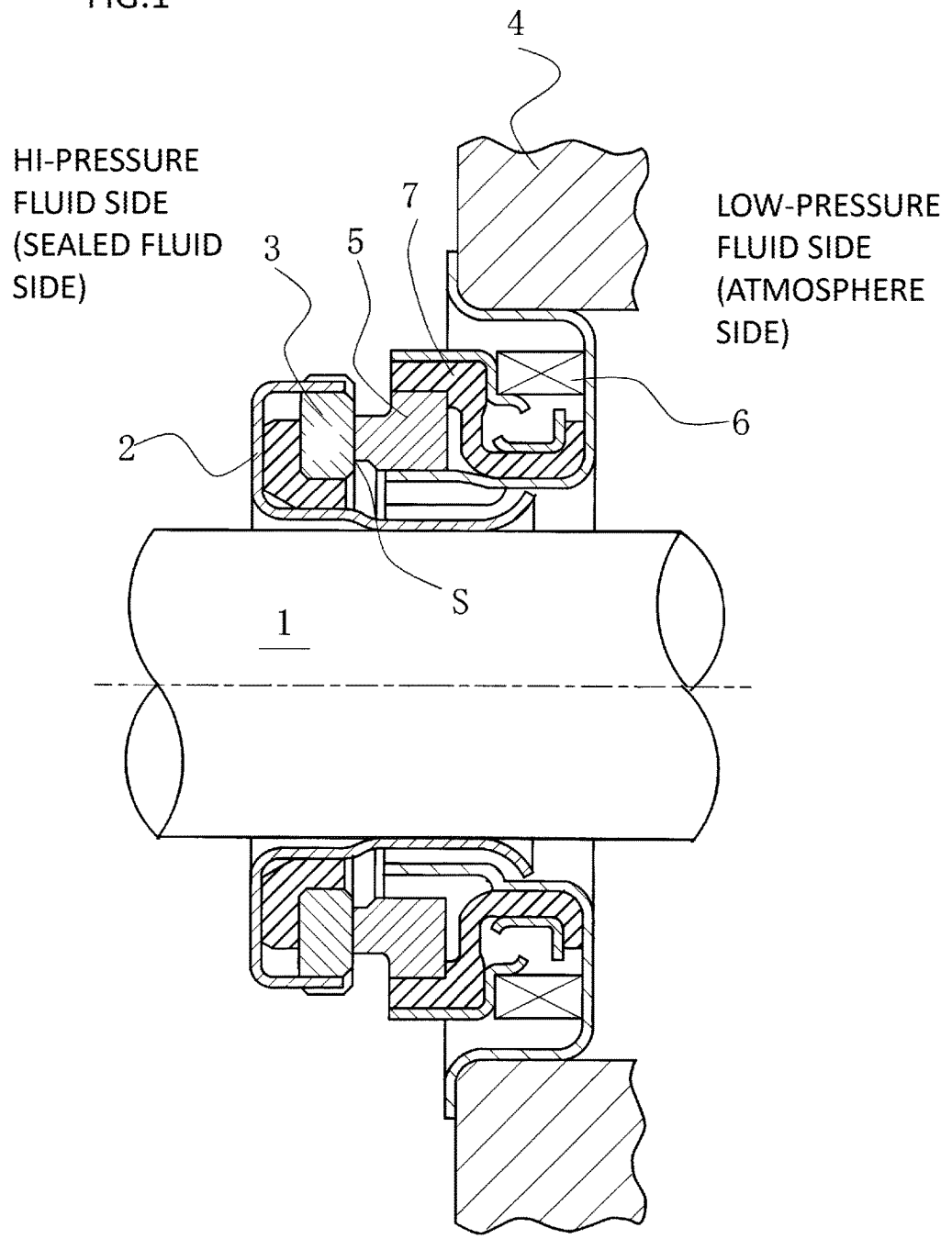
FIG. 1 is a longitudinal sectional view showing an example of a mechanical seal according to a first embodiment of the present invention.
Figure 2:
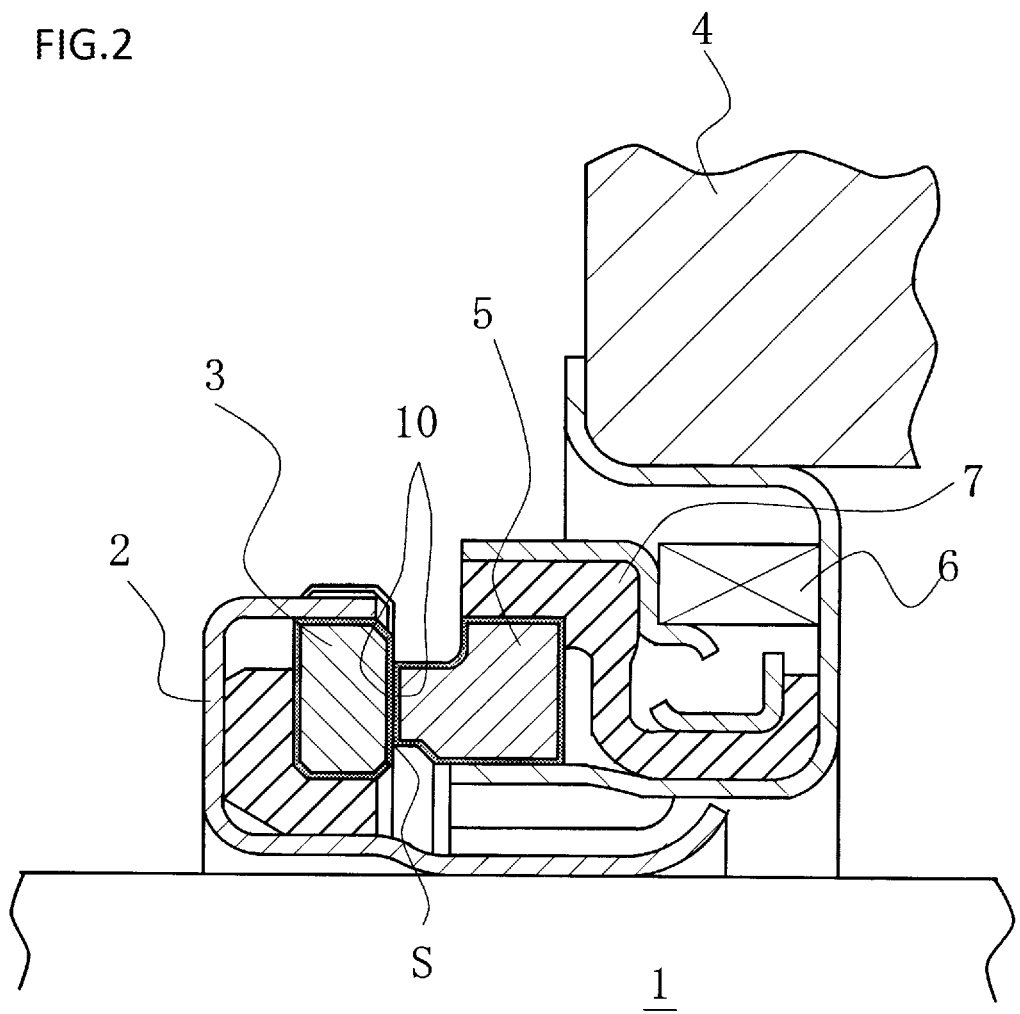
FIG. 2 is an enlarged view of a main part of FIG. 1 and shows a state that a DLC film is laminated on a surface of a base material of stationary-side seal ring and a rotating-side seal ring.

With reference to FIG. 1 and FIG. 2, a slide component according to the present invention will be described.

In the present embodiment, a mechanical seal which is an example of the slide component will be described as an example. Although the outer peripheral side of the slide component constituting the mechanical seal is described as a high-pressure fluid side (a sealed fluid side) and the inner peripheral side thereof is described as a low-pressure fluid side (an atmosphere side), the present invention is not limited thereto, and is also applicable to a case where the high-pressure fluid side and the low-pressure fluid side are reverse.

FIG. 1 is a longitudinal sectional view showing an example of the mechanical seal, which is an inside mechanical seal in a form of sealing a sealed fluid on a high-pressure fluid side tending to leak from an outer periphery of sliding faces toward an inner peripheral direction. The mechanical seal is provided, on the side of a rotating shaft 1 to drive a pump impeller (not shown) on the high-pressure fluid side, with a circular ring-shaped rotating-side seal ring 3 which is one slide component provided in a state of being integrally rotatable with the rotating shaft 1 via a sleeve 2, and at a housing 4 of a pump, with a circular ring-shaped stationary-side seal ring 5 which is the other slide component provided in a state of being non-rotatable and axially movable. By a coiled wave spring 6 and a bellows 7 axially biasing the stationary-side seal ring 5, the rotating-side seal ring 3 and the stationary-side seal ring 5 slide in close contact with each other on sliding faces S. That is, the mechanical seal prevents, at each other's sliding faces S of the rotating-side seal ring 3 and the stationary-side seal ring 5, a sealed fluid from flowing out from the outer periphery of the rotating shaft 1 to an atmosphere side.

In addition, FIG. 1 shows a case where the width of the sliding face of the rotating-side seal ring 3 is wider than the width of the sliding face of the stationary-side seal ring 5, but the present invention is not limited thereto, and is of course also applicable to the reverse case.

The sealed fluid is a silicate containing fluid such as an LLC to which silicate is added.

Usually, although the materials of the rotating-side seal ring 3 and the stationary-side seal ring 5 are selected from silicon carbide (SiC) excellent in wear resistance, carbon excellent in self-lubricity, and the like, for example, a combination in which both materials are silicon carbide or a combination in which the material of the rotating-side seal ring 3 is silicon carbide and the material of the stationary-side seal ring 5 is carbon is possible.

In particular, silicon carbide has been known as a preferred material having good heat dissipation performance and excellent in wear resistance as a seal material of the mechanical seal and the like. However, as described above, since the material consisting of silicon carbide contains silicon, in a case where a sealed fluid is a fluid such as an LLC containing silicate, there is a problem in that a silicate compound is deposited on a sliding face and smoothness of the sliding face is lost, which leads to leakage of LLC.

Moreover, a DLC film which is coated on a surface of a seal material of a conventional mechanical seal is characterized by containing silicon in order to improve adhesion to a base material and decrease friction coefficient, and as with the case of silicon carbide, there is a problem in that a silicate compound is deposited on a sliding face and smoothness of the sliding face is lost, which leads to leakage of LLC.

Therefore, in the present invention, on at least either one sliding face S of the rotating-side seal ring 3 and the stationary-side seal ring 5, an amorphous carbon film formed by using hydrocarbon gas (source gas) not containing organosilicon compound gas in a plasma CVD (Chemical Vapor Deposition) method is laminated. That is, the amorphous carbon film of the present invention is characterized by not containing silicon as much as possible.

In addition, as will be described later, even if forming a film by using hydrocarbon gas not containing organosilicon compound gas, an extremely small amount of silicon derived from the base material may be contained in the amorphous carbon film.

The amorphous carbon film is a carbon film of amorphous structure having both bonds of diamond and graphite, and is collectively called diamond-like carbon (DLC).

In the present embodiment, as shown in FIG. 2, amorphous carbon films 10 formed by using source gas not containing organosilicon compound gas are laminated on surfaces of the rotating-side seal ring 3 and the stationary-side seal ring 5.

The amorphous carbon films 10 are, for example, formed by a plasma CVD (Chemical Vapor Deposition) method such as a direct current plasma CVD method.

In the plasma CVD method, while introducing a source gas consisting of hydrocarbon gas such as acetylene gas, ethylene gas, propylene gas, and methane gas into a treatment chamber for accommodating the base material of the rotating-side seal ring 3 and the stationary-side seal ring 5, chemically active ions are produced by bombarding electrons having energy of ionization potential or more with the source gas. Thereby, the source gas turned into plasma exists around the surface of the base materials of the rotating-side seal ring 3 and the stationary-side seal ring 5. At this time, the source gas turned into plasma is laminated on the base materials of the rotating-side seal ring 3 and the stationary-side seal ring 5 which are arranged on the electrode side and the amorphous carbon films 10 are formed.

On that occasion, organosilicon compound gas is not contained in the source gas consisting of hydrocarbon gas such as ethylene gas, propylene gas, and the like at all. The formed amorphous carbon film does not contain silicon. Therefore, even if the sealed fluid is a silicate containing fluid such as an LLC to which silicate is added, a silicate compound does not deposit on the sliding face.

In a case where the materials of the base materials of the rotating-side seal ring 3 and the stationary-side seal ring 5 are silicon carbide, a silicon component is discharged as an out gas from the base material of silicon carbide by plasma treatment even if organosilicon compound gas is not contained in the source gas. Therefore, a small amount of silicon is contained in the formed amorphous carbon films.

However, even in that case, in the present invention, since organosilicon compound gas is not contained in the source gas consisting of hydrocarbon gas in a plasma CVD method, silicon contained in the formed amorphous films becomes an extremely small amount.

EXAMPLES

Hereinafter, the present invention will be described in more detail by examples, but the present invention is not limited to those examples.

Other terms and concepts according to the present invention are based on the meanings of the terms idiomatically used in the art, and various techniques used for carrying out the present invention can be easily and positively embodied by one of ordinary skill in the art based on known literature and the like, particularly except for the techniques whose sources are specified.

Example 1

The surface of the ring-shaped base material consisting of silicon carbide shaped for the rotating-side seal ring 3 and the stationary-side seal ring 5 was smoothly processed by lapping. The amorphous carbon films having a thickness of 796 nm were laminated on the surfaces of the base materials of the rotating-side seal ring 3 and the stationary-side seal ring 5 by using hydrocarbon gas not containing organosilicon compound gas in a plasma CVD device, and a slide test was conducted under the following test conditions.

In this case, the content of silicon discharged from the base material consisting of silicon carbide as the out gas by plasma treatment and contained in the amorphous carbon film was 0.34 at %.

In addition, the content of silicon contained in the amorphous carbon film was obtained by narrow measurement in an X-ray photoelectron spectroscopy (XPS) (PHI Quantera SMX manufactured by ULVAC-PHI, Inc.). Moreover, the film thickness was obtained by cross section exposing with a cross section specimen preparation device (CP) and by observing the cross section with an FE-SEM (SU 8220 manufactured by Hitachi, Ltd.).

Slide Test Conditions
   a Sliding face pressure: 0.3 MPa
   b Sealed fluid: Silicate containing LLC 50 wt % aqueous solution
   c Pressure of sealed fluid: 0.1 MPaG
   d Peripheral speed: 0 m/s (3 seconds) ↔ 1 m/s (3 seconds)
   e Test time: 500 hours The slide test results are shown in the following Table 1.

Example 2

In the Example 1, the amorphous carbon film was laminated only on the surface of the base material of the stationary-side seal ring 5 and not laminated on the rotating-side seal ring 3, and a test was conducted under the slide test conditions in the Example 1.

The slide test results are shown in the following Table 1.

Example 3

In the Example 1, by changing the treating time of plasma CVD to one-fifth (the point in that the source gas not containing organosilicon compound gas is used is same as the Example 1), the amorphous carbon films having 0.07 at % of the content of silicon contained therein and a film thickness of 174 nm were laminated on the surfaces of the base materials of the rotating-side seal ring 3 and the stationary-side seal ring 5, and a test was conducted under the slide test conditions in the Example 1.

The slide test results are shown in the following Table 1.

Example 4

In the Example 3, the amorphous carbon film was laminated only on the surface of the base material of the stationary-side seal ring 5 and not laminated on the rotating-side seal ring 3, and a test was conducted under the slide test conditions in the Example 1.

The slide test results are shown in the following Table 1.

Comparative Example 1

The surface of the ring-shaped base material consisting of silicon carbide shaped for the rotating-side seal ring 3 and the stationary-side seal ring 5 was smoothly processed by lapping, and thereafter a test was conducted under the slide test conditions in the Example 1 without executing film forming process on the surface of the base material.

The slide test results are shown in the following Table 1.

Comparative Example 2

By using the source gas consisting of hydrocarbon gas containing organosilicon compound gas in the plasma CVD device, the amorphous carbon film having 1.69 at % of the content of silicon contained therein and a film thickness of 117 nm were laminated only on the surface of the base material of the stationary-side seal ring 5 and not laminated on the rotating-side seal ring 3, and a test was conducted under the slide test conditions in the Example 1.

The slide test results are shown in the following Table 1.

Comparative Example 3

By using the source gas consisting of hydrocarbon gas containing organosilicon compound gas in the plasma CVD device, the amorphous carbon film having 1.85 at % of the content of silicon contained therein and a film thickness of 1400 nm were laminated only on the surface of the base material of the stationary-side seal ring 5 and not laminated on the rotating-side seal ring 3, and a test was conducted under the slide test conditions in the Example 1.

The slide test results are shown in the following Table 1.

Comparative Example 4

By using a carbon target which is a material becoming a thin film formed into a plate shape or a disc shape in a PVD (Physical Vapor Deposition) film forming device capable of forming a hydrogen-free amorphous carbon film, the amorphous carbon films having 2.3 at % of the content of silicon derived from the base materials and contained therein and a film thickness of 280 nm were laminated on the surfaces of the base materials of the rotating-side seal ring 3 and the stationary-side seal ring 5, and a test was conducted under the slide test conditions in the Example 1.

The slide test results are shown in the following Table 1.

TABLE 1

|  | Example 1 | Example 2 | Example 3 | Example 4 |
|---|---|---|---|---|
| Film forming device | CVD | CVD | CVD | CVD |
| Si content (at %) | 0.34 | 0.34 | 0.07 | 0.07 |
| Film thickness (nm) | 796 | 796 | 174 | 174 |
| Stationary-side seal ring film forming process | Yes | Yes | Yes | Yes |
| Rotating-side seal ring film forming process | Yes | No | Yes | No |
| Slide test result (Leakage due to silicate compound deposition) | No | No | No | No |

|  | Comparative example 1 | Comparative example 2 | Comparative example 3 | Comparative example 4 |
|---|---|---|---|---|
| Film forming device | — | CVD | CVD | PVD |
| Si content (at %) | 25.09 | 1.69 | 1.85 | 2.3 |
| Film thickness (nm) | — | 117 | 1400 | 280 |
| Stationary-side seal ring film forming process | No | Yes | Yes | Yes |
| Rotating-side seal ring film forming process | No | No | No | No |
| Slide test result (Leakage due to silicate compound deposition) | Yes | Yes | Yes | Yes |

From the above results, it was confirmed that even if silicon carbide is used as the base materials of the rotating-side seal ring 3 and the stationary-side seal ring 5, in a case where the amorphous carbon film formed by using hydrocarbon gas not containing organosilicon compound gas in the plasma CVD device is laminated on the surface of at least one base material of the rotating-side seal ring 3 and the stationary-side seal ring 5, leakage due to deposition of a silicate compound does not occur. On the other hand, it was confirmed that in a case where silicon carbide is used as the base materials of the rotating-side seal ring 3 and the stationary-side seal ring 5, if the amorphous carbon film formed by using hydrocarbon gas containing organosilicon compound gas in the plasma CVD device is laminated on the surface of at least one base material of the rotating-side seal ring 3 and the stationary-side seal ring 5, leakage due to deposition of a silicate compound occurs. Moreover, it was confirmed that in the case where silicon carbide is used as the base materials of the rotating-side seal ring 3 and the stationary-side seal ring 5 and film forming process is not executed on the surfaces of the base materials, leakage due to deposition of a silicate compound occurs too.

Hereinbefore, although the present invention has been described by the embodiments and the drawings, its detailed configuration is not limited thereto, and any changes and additions made without departing from the scope of the present invention are included in the present invention.

For example, although, in the above embodiments, an example in which a slide component is used for one of a pair of a rotating seal ring and a stationary seal ring in a mechanical seal device has been described, it may be used as a slide component of a bearing that slides on a rotating shaft while sealing a lubricating oil on one side in an axial direction of a cylindrical sliding face.

Moreover, for example, although, in the above embodiments, a case where a high-pressure sealed fluid exists on the outer peripheral side has been described, the present invention is also applicable to a case where the high-pressure fluid exists on the inner peripheral side.

REFERENCE SIGN LIST

1 Rotating shaft
2 Sleeve
3 Rotating-side seal ring
4 Housing
5 Stationary-side seal ring
6 Coiled wave spring
7 Bellows
10 Amorphous carbon film

The invention claimed is:

1. A slide component which includes a circular ring-shaped stationary-side seal ring fixed to a stationary side and a circular ring-shaped rotating-side seal ring rotating with a rotating shaft, and relatively rotates respective opposed sliding faces of the stationary-side seal ring and the rotating-side seal ring, for sealing a sealed fluid containing silicate present on one side in a radial direction of the sliding faces relatively rotating and sliding, wherein:
at least either one of the sliding faces of the stationary-side seal ring and the rotating-side seal ring is coated with an amorphous carbon film containing 0.34 at % or less of silicon in a manner preventing deposition of a silicate component contained in the sealed fluid on the sliding faces.

2. The slide component according to claim 1, wherein a base material of the stationary-side seal ring or the rotating-side seal ring is silicon carbide.

3. The slide component according to claim 1, wherein the amorphous carbon film is a film formed from hydrocarbon gas containing no organosilicon compound gas by plasma CVD.

4. The slide component according to claim 2, wherein the amorphous carbon film is a film formed from hydrocarbon gas containing no organosilicon compound gas by plasma CVD.

* * * * *